United States Patent
Cao et al.

(10) Patent No.: US 8,748,982 B2
(45) Date of Patent: Jun. 10, 2014

(54) HIGH BREAKDOWN VOLTAGE SEMICONDUCTOR DEVICE

(71) Applicant: Fuji Electric Co., Ltd., Kawasaki (JP)

(72) Inventors: Dawei Cao, Matsumoto (JP); Mutsumi Kitamura, Matsumoto (JP); Takahiro Tamura, Matsumoto (JP); Yasuhiko Onishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 14/053,723

(22) Filed: Oct. 15, 2013

(65) Prior Publication Data

US 2014/0035002 A1    Feb. 6, 2014

Related U.S. Application Data

(63) Continuation of application No. PCT/JP2012/063685, filed on May 28, 2012.

(30) Foreign Application Priority Data

Jul. 14, 2011   (JP) .................................. 2011-155577

(51) Int. Cl.
*H01L 29/66*   (2006.01)
*H01L 21/02*   (2006.01)

(52) U.S. Cl.
USPC ........... 257/341; 257/196; 257/328; 257/342; 257/367

(58) Field of Classification Search
USPC .................. 257/196, 197, 328, 341, 342, 367
See application file for complete search history.

(56) References Cited

U.S. PATENT DOCUMENTS

| | | | |
|---|---|---|---|
| 6,677,626 B1 | 1/2004 | Shindou et al. | |
| 7,002,205 B2 * | 2/2006 | Onishi et al. | .................. 257/328 |
| 2003/0176031 A1 | 9/2003 | Onishi et al. | |
| 2007/0272977 A1 | 11/2007 | Saito et al. | |

FOREIGN PATENT DOCUMENTS

| | | |
|---|---|---|
| JP | 2000-277726 A | 10/2000 |
| JP | 2001-015752 A | 1/2001 |
| JP | 2003-224273 A | 8/2003 |
| JP | 2005-203565 A | 7/2005 |
| JP | 2007-266505 A | 10/2007 |
| WO | 2013/008543 A1 | 1/2013 |

* cited by examiner

*Primary Examiner* — George Fourson, III
*Assistant Examiner* — Wilner Jean Baptiste
(74) *Attorney, Agent, or Firm* — Rossi, Kimms & McDowell LLP

(57) ABSTRACT

Semiconductor regions are alternately arranged in a parallel pn layer in which an n-type region and a p-type region are alternately arranged parallel to the main surface of a semiconductor substrate. Pitch between n drift region and p partition region of a second parallel pn layer in an edge termination region is two thirds of pitch between n drift region and p partition region of a first parallel pn layer in an active region. At boundaries between main SJ cells and fine SJ cells at four corners of the semiconductor substrate having rectangular shape in plan view, ends of two pitches of main SJ cells face the ends of three pitches of fine SJ cells. In this way, it is possible to reduce the influence of a process variation and thus reduce mutual diffusion between n drift region and p partition region of the fine SJ cell.

6 Claims, 6 Drawing Sheets

HIGH BREAKDOWN VOLTAGE SEMICONDUCTOR DEVICE

BACKGROUND OF THE INVENTION

A. Field of the Invention

The present invention relates to a high breakdown voltage semiconductor device, such as a MOS (a metal-oxide-semiconductor) field effect transistor, and more particularly to a vertical high breakdown voltage semiconductor device which has a superjunction structure and in which a main current flows between two main surfaces of a semiconductor substrate.

B. Description of the Related Art

In the general vertical MOSFET (Metal oxide semiconductor field effect transistor), a high-resistivity n⁻ drift layer has a function of making a drift current flow in the vertical direction (the depth direction of the substrate) in an on state. Therefore, when the current path of the n⁻ drift layer is shortened, that is, when the thickness of the n⁻ drift layer is reduced, drift resistance is reduced, which substantially reduces the on-resistance of the MOSFET.

In an off state, the high-resistivity n⁻ drift layer is depleted to sustain a high breakdown voltage. Therefore, when the thickness of the high-resistivity n⁻ drift layer is too thin, the breakdown voltage becomes low and the depletion layer which is spread from the pn junction between a p base region and an n⁻ drift layer reaches a drain electrode at a low applied voltage. When the high-resistivity n⁻ drift layer is thick, a reverse bias voltage which reaches the critical electrical field strength of silicon (Si) increases. Therefore, a high breakdown voltage semiconductor device is obtained.

However, when the high-resistivity n– drift layer is too thick, the on-resistance increases, which results in an increase in power loss. As such, in the vertical MOSFET, since there is a tradeoff relationship between the specific on-resistance and the breakdown voltage, in general, it is difficult to improve the characteristics of both the specific on-resistance and the breakdown voltage at the same time.

As a device for improving a plurality of semiconductor characteristics having the tradeoff relationship therebetween at the same time, a superjunction semiconductor device has been known which has a superjunction (hereinafter, referred to as SJ) structure in which p-type regions and n-type regions are alternately arranged each other in a drift layer. When the SJ structure is applied to a vertical high-breakdown-voltage semiconductor device, the p-type regions and the n-type regions which extend in the depth direction of the substrate and have a small width are alternately arranged in the n⁻ drift layer in a direction parallel to the main surface of substrate (hereinafter, referred to as a parallel pn layer).

In the parallel pn layer including a plurality of p-type regions and n-type regions, even when each of the p-type region and the n-type region is a region with high impurity concentration, the depletion layer which is spread from the pn junction between all of the regions in the parallel pn layer at a low applied voltage in an off-state has such a small width that both regions are rapidly depleted. Therefore, the parallel pn layer has been known as a structure capable of improving both low on-resistance and high breakdown voltage at the same time. However, in order to obtain high breakdown voltage using the SJ structure in practice, it is important to control the amounts of impurities in the p-type region and the n-type region so as to be as equal as possible.

In addition, in the vertical MOSFET in which the SJ structure is formed in the n⁻ drift layer of the active region in which the main current flows, the configuration of the edge termination region surrounding the active region needs to be different from that of the general power MOSFET. That is, an edge termination region which is appropriately designed so as to maintain a high breakdown voltage is needed in order to increase the breakdown voltage of the MOSFET having the SJ structure. In general, the edge termination region needs to maintain a breakdown voltage higher than that of the active region. Therefore, the SJ structure is formed in the edge termination region. In the edge termination region, when the amount of impurity in the n-type region is not equal to the amount of impurity in the p-type region, the breakdown voltage of the edge termination region is reduced, which leads to a reduction in the breakdown voltage of the high breakdown voltage semiconductor device.

In order to solve this problem, a structure has been known in which the amount of impurity in the parallel pn layer of the edge termination region is half the amount of impurity in the parallel pn layer of the active region (for example, see JP 2000-277726 A and JP 2003-224273 A).

In JP 2000-277726 A and JP 2003-224273 A, in order to set the amount of impurity in the parallel pn layer of the edge termination region to half the amount of impurity in the parallel pn layer of the active region, the dose of impurity ions implanted into the edge termination region may be half the dose of impurity ions implanted into the active region, or the width of an opening formed in a mask for impurity ion implantation in the active region may be half the width of an opening formed in a mask for impurity ion implantation in the edge termination region. For example, as a detailed method of setting the dose of impurity ions implanted into the edge termination region to half the dose of impurity ions implanted into the active region, a method has been proposed in which the implantation of impurity ions are separately performed the number of times impurity ions implanted into the edge termination region is less than the number of times impurity ions implanted into the active region. However, in this case, production efficiency is reduced and costs increase.

The method of setting the width of the opening formed in the mask for impurity ion implantation in the active region to half the width of the opening formed in the mask for impurity ion implantation in the edge termination region can be easily achieved only by changing the width of the opening in the mask. However, a microfabrication process is needed in order to set the width of the opening formed in the mask in the active region to half the width of the opening formed in the mask in the edge termination region. Therefore, in practice, the parallel pn layer in the edge termination region is likely to be affected by a process variation. In addition, a reduction in the width or the pitch between the p-type region and the n-type region in the parallel pn layer is effective in improving a breakdown voltage, but the diffusion (hereinafter, referred to as mutual diffusion) between p-type impurities in the p-type region and n-type impurities in the n-type region increases. As a result, there is a concern that an impurity concentration variation will increase or a parallel pn layer is not formed.

The present invention is directed to overcoming or at least reducing the effects of one or more of the problems set forth above.

SUMMARY OF THE INVENTION

In order to solve the problems of the related art described above, the invention provides a high breakdown voltage semiconductor device which reduces the influence of a process variation and reduce mutual diffusion between a p-type region and an n-type region forming a second parallel pn layer of an edge termination region. Furthermore, in order to solve the problems of the related art described above, the invention provides a high breakdown voltage semiconductor device having a superjunction which is easily laid out.

In order to solve the above-mentioned problems, a high breakdown voltage semiconductor device according to the invention includes parallel pn layers that serve as drift layers and includes first-conductivity-type semiconductor regions and second-conductivity-type semiconductor regions which have a longitudinal shape in a direction perpendicular to one main surface of a semiconductor substrate that is a first conductivity-type and has high impurity concentration and are alternately adjacent to each other in a direction parallel to the main surface of the semiconductor substrate. A current flows through the parallel pn layer in an on-state and the parallel pn layer is depleted in an off-state to sustain a reverse blocking voltage. The high breakdown voltage semiconductor device has the following characteristics. The parallel pn layers include first parallel pn layers that are provided in an active region serving as a main current path and second parallel pn layers that are provided in an edge termination region surrounding the active region. The number of adjacency in the parallel pn layer is an even number. A pitch between the first-conductivity-type semiconductor region and the second-conductivity-type semiconductor region adjacent to each other in the second parallel pn layer is two thirds of a pitch between the first-conductivity-type semiconductor region and the second-conductivity-type semiconductor region adjacent to each other in the first parallel pn layer. A boundary between the first parallel pn layer and the second parallel pn layer at four corners of the semiconductor substrate which has a rectangular shape in a plan view faces two adjacent ends of the first parallel pn layers and three adjacent ends of the second parallel pn layers.

The high breakdown voltage semiconductor device according to the invention may further include a low-concentration first-conductivity-type semiconductor region that is provided in a surface of the second parallel pn layer and has an impurity concentration lower than that of the first-conductivity-type semiconductor region of the first parallel pn layer.

In the high breakdown voltage semiconductor device according to the invention, the first parallel pn layers may have a stripe-shaped planar layout in which they extend in a direction perpendicular to a direction in which the first-conductivity-type semiconductor regions and the second-conductivity-type semiconductor regions are alternately arranged.

In the high breakdown voltage semiconductor device according to the invention, the lengths of the ends of the first parallel pn layers disposed at the four corners of the semiconductor substrate may be changed for every even-numbered pitch to form curved portions in parts of the outer circumference of the active region which are arranged in the vicinity of the four corners of the edge termination region, and the innermost end of the second parallel pn layer may have a length corresponding to the curved portion and extend to the inside of the semiconductor substrate in parallel to the main surface of the semiconductor substrate.

In the high breakdown voltage semiconductor device according to the invention, the first parallel pn layers may have a planar layout in which the second-conductivity-type semiconductor regions are arranged in a matrix in the first-conductivity-type semiconductor region.

In the high breakdown voltage semiconductor device according to the invention, the semiconductor region in the parallel pn layer may not include a transition portion for a charge balance. The charge balance means that the amounts of impurity in the first-conductivity-type semiconductor region and the second-conductivity-type semiconductor region in the parallel pn layer are equal to each other.

According to the invention, since the pitch between the second parallel pn layers in the edge termination region is two thirds of the pitch between the first parallel pn layers in the active region, it is possible to reduce a process variation and mutual diffusion between the first-conductivity-type semiconductor region and the second-conductivity-type semiconductor region in the parallel pn layer, as compared to the SJ structure according to the related art. In addition, according to the invention, since the semiconductor region in the parallel pn layer does not include the transition portion for a charge balance, the drift layer is depleted at the lowest breakdown voltage in an off state. Therefore, it is easy to obtain the highest breakdown voltage.

According to the high breakdown voltage semiconductor device of the invention, it is possible to reduce the influence of a process variation and the mutual diffusion between the p-type region and the n-type region forming the second parallel pn layer in the edge termination region. In addition, according to the high breakdown voltage semiconductor device of the invention, it is possible to provide a high breakdown voltage semiconductor device with a superjunction which is easily laid out.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
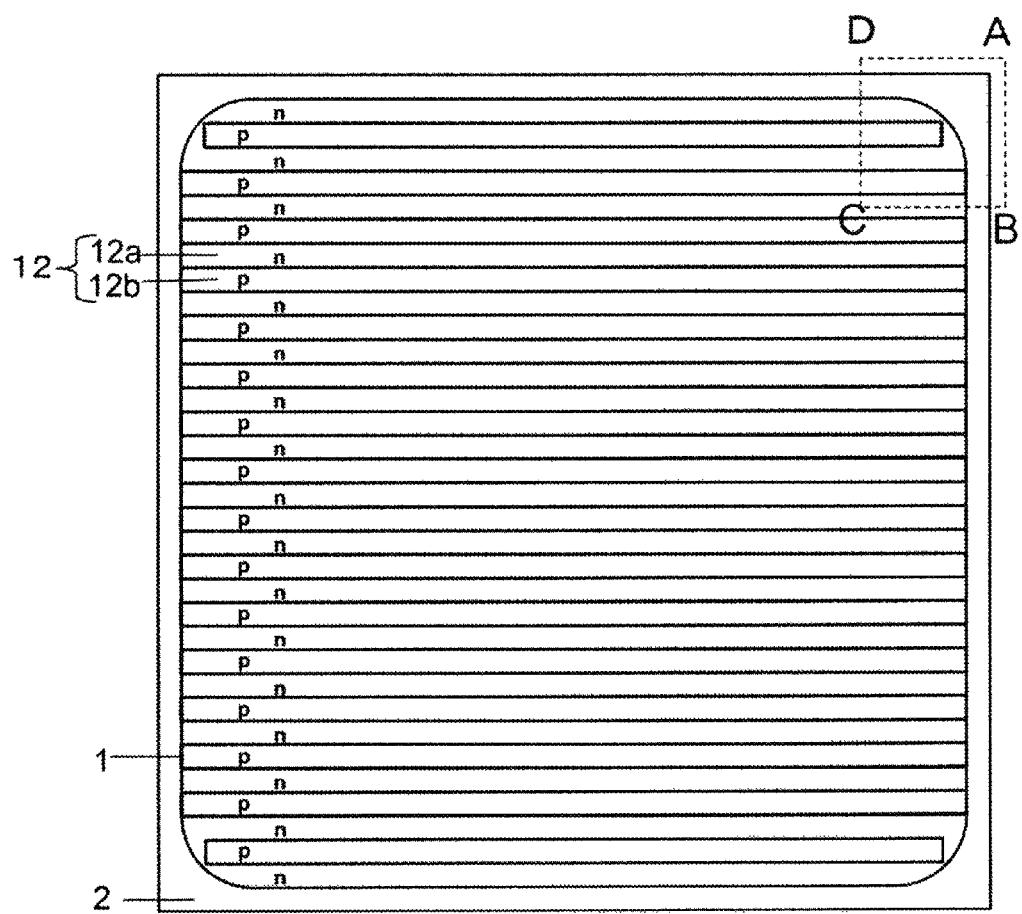
FIG. 1 is a plan view illustrating a structure of an SJ-MOSFET according to a first embodiment of the invention.

Hereinafter, high breakdown voltage semiconductor devices according to exemplary embodiments of the invention will be described in detail with reference to the accompanying drawings. In the specification and the accompanying drawings, in the layers or regions having "n" or "p" appended thereto, an electron or a hole is a major carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In the following description, a first conductivity-type is an n type and a second conductivity-type is a p type.

First Embodiment

Figure 2:
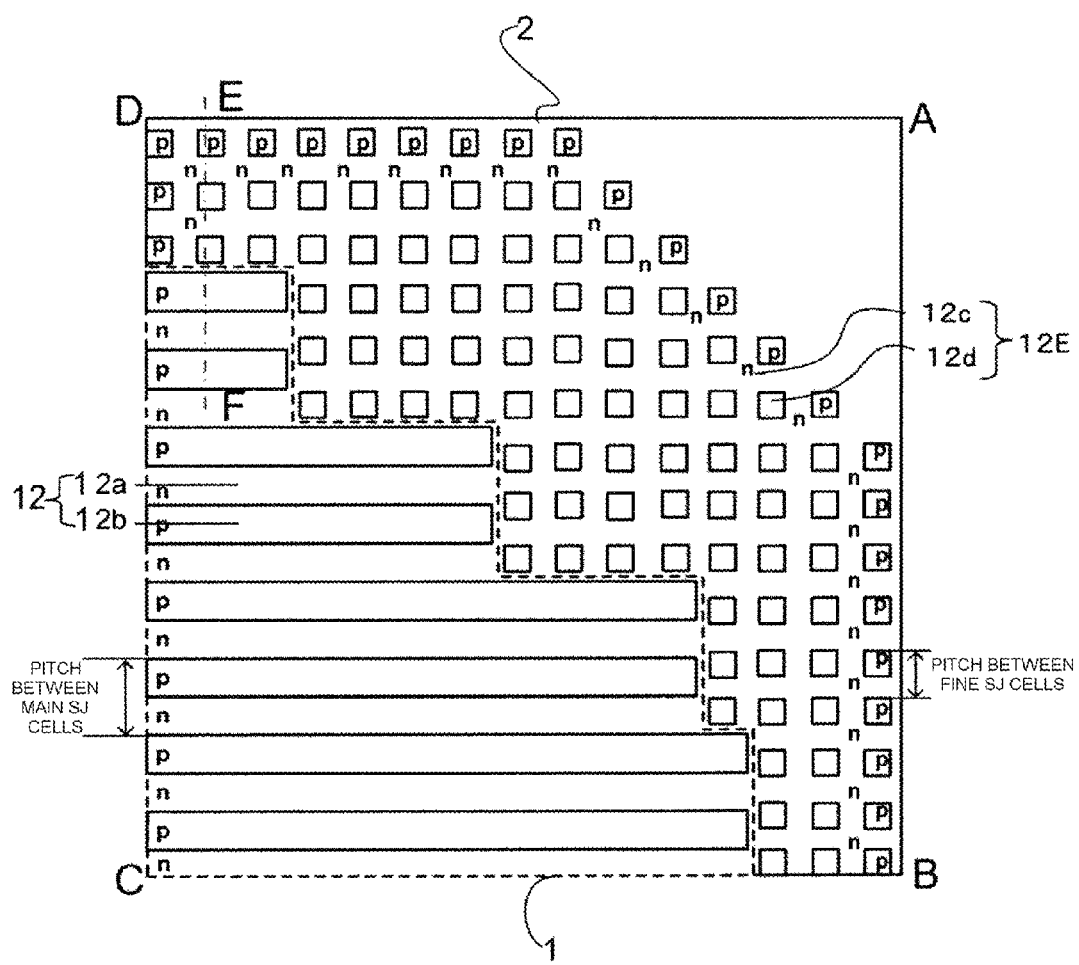
FIG. 2 is an enlarged plan view illustrating a portion surrounded by a rectangle having vertexes A, B, C, and D in FIG. 1.

As an example of a high breakdown voltage semiconductor device according to a first embodiment, a vertical MOSFET (hereinafter, referred to as an SJ-MOSFET) with a superjunction (SJ) structure will be described. FIG. 1 is a plan view illustrating the structure of the SJ-MOSFET according to the first embodiment of the invention. FIG. 2 is an enlarged plan view illustrating a portion surrounded by a rectangle having vertexes A, B, C, and D in FIG. 1. FIGS. 1 and 2 illustrate only the planar layout of the SJ structure in order to clarify the planar structure of the SJ structure.

As illustrated in FIGS. 1 and 2, in the SJ-MOSFET according to the first embodiment of the invention, main SJ cells are provided in a drift layer in active region 1 and fine SJ cells are provided in the drift layer in edge termination region 2. Active region 1 is a region which serves as a current path when the device is turned on. Edge termination region 2 is a region which reduces the electrical field in the periphery of active region 1 and sustains a breakdown voltage. Edge termination region 2 is disposed in the outer circumference of active region 1. FIG. 1 illustrates the planar layout of only first parallel pn layer 12 and FIG. 2 is an enlarged view illustrating a portion surrounded by the rectangle (hereinafter, referred to as a rectangle ABCD) having the vertexes A, B, C, and D at the corner of the chip illustrated in FIG. 1 and illustrates the planar layout of main SJ cells 12 and fine SJ cells 12E at the corner of the chip.

Main SJ cells 12 are first parallel pn layers in which n-type regions 12a and p-type regions 12b are alternately arranged in a direction parallel to the main surface of a substrate in active region 1. Main SJ cell 12 has, for example, a stripe-shaped planar layout which extends in a direction perpendicular to the direction in which n-type regions 12a and p-type regions 12b are alternately arranged. Fine SJ cells 12E are second parallel pn layers in which n-type regions 12c and p-type regions 12d are alternately arranged in a direction parallel to the main surface of the substrate in edge termination region 2. Fine SJ cells 12E have, for example, a planar layout in which p-type regions 12d are arranged in a matrix in n-type region 12c.

Specifically, as illustrated in FIG. 2, for the second parallel pn layers (fine SJ cells 12E) in edge termination region 2, n-type regions 12c forming fine SJ cells 12E have a lattice-shaped planar layout. At the corners of the chip, the lengths of every two sets of main SJ cells 12 in the direction parallel to the main surface of the substrate are changed at the ends of the first parallel pn layers (main SJ cells 12) close to the edge termination region in active region 1, thereby forming curved portions as a whole. At the inner ends of the second parallel pn layers (fine SJ cells 12E) in edge termination region 2, three sets of fine SJ cells 12E corresponding to the shape of the ends of the first parallel pn layers (main SJ cells 12) are arranged. One n-type region and one p-type region adjacent to the n-type region in the parallel pn layer form one set.

Figure 3:
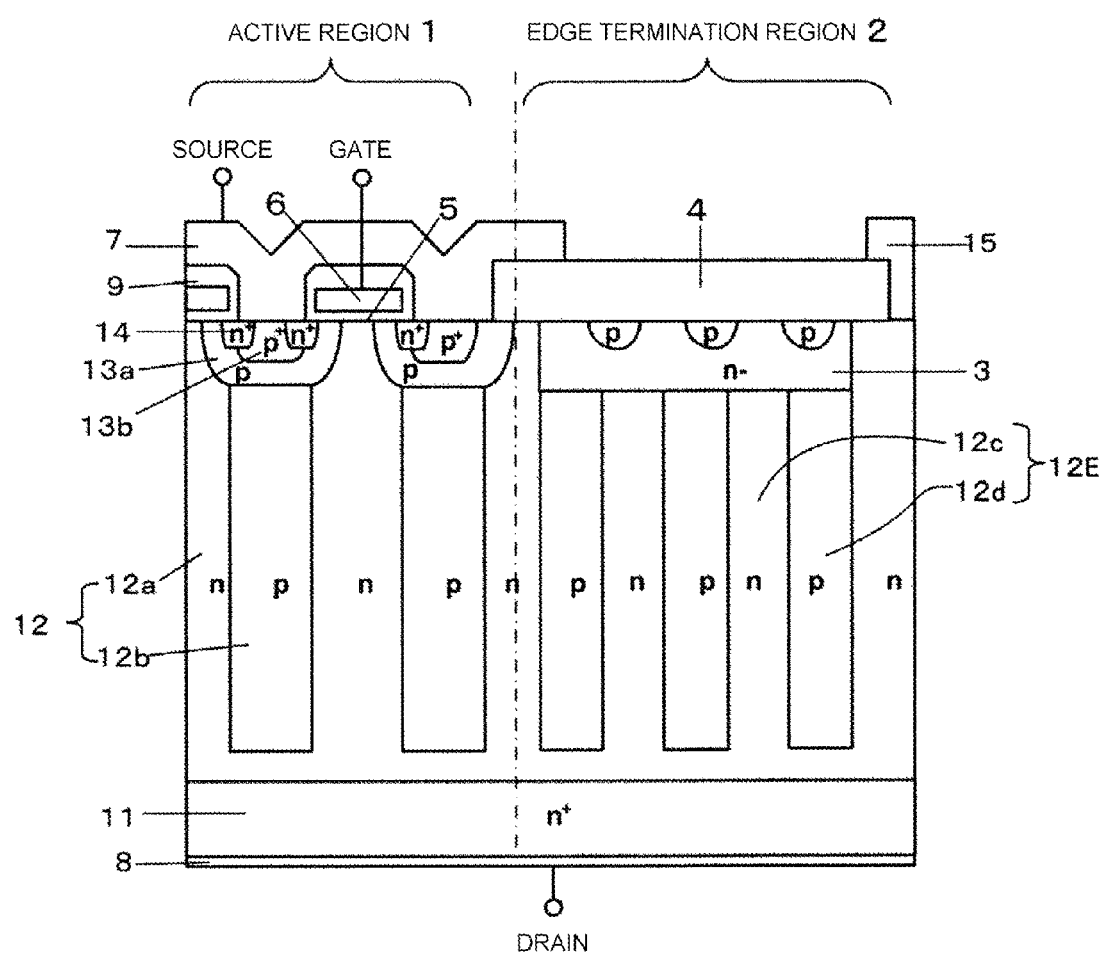
FIG. 3 is a cross-sectional view illustrating a cross-sectional structure along the cutting line E-F of FIG. 2.

As such, the SJ-MOSFET according to the first embodiment includes the first parallel pn layers (main SJ cells 12) which are provided in the drift layer in active region 1 and the second parallel pn layers (fine SJ cells 12E) which are provided in the drift layer in edge termination region 2. Next, the cross-sectional structure of the SJ-MOSFET according to the first embodiment will be described. FIG. 3 is a cross-sectional view illustrating the cross-sectional structure along the cutting line E-F of FIG. 2. The cutting line E-F traverses main SJ cells 12 and fine SJ cells 12E.

As illustrated in FIG. 3, main SJ cells 12 and fine SJ cells 12E are formed in an n-type region which is an n-type drift region provided on the surface of n⁺ semiconductor substrate 11. Specifically, main SJ cells 12 and fine SJ cells 12E longitudinally extend from the main surface of the n-type drift region to n⁺ semiconductor substrate 11 in a direction perpendicular to the main surface and include n-type regions (hereinafter, referred to as n drift regions) 12a and 12c and p-type regions (hereinafter, referred to as p partition regions) 12b and 12d which are alternately arranged in a direction (lateral direction) parallel to the main surface of the substrate. N⁺ semiconductor substrate 11 has a resistance (high impurity concentration) lower than n drift regions 12a and 12c.

A backside electrode is provided on the backside surface of n⁺ semiconductor substrate 11. N⁺ semiconductor substrate 11 functions as an n⁺ drain region and the backside electrode functions as drain electrode 8. In the SJ structure, the width of each region in the lateral direction is set such that, when a device is turned off, a depletion layer is rapidly spread from a pn junction between n drift region 12a and p partition region 12b to n drift region 12a and p partition region 12b on both sides of the pn junction and carriers are completely swept out at a low voltage. In this way, it is possible to obtain a high breakdown voltage.

In active region 1, p base region 13a is provided in a surface layer of each p partition region 12b opposite to n⁺ semiconductor substrate 11. N⁺ source region 14 and p⁺ contact region 13b are provided in a surface layer of p base region 13a. The impurity concentration of p⁺ contact region 13b is higher than that of p base region 13a. Gate electrode 6, which is a polycrystalline silicon film, is provided on the surface of p base region 13a interposed between n⁺ source region 14 and n drift region 12a, with gate insulating film 5 interposed between. Source electrode 7, which is an aluminum-silicon film, is provided on the surfaces of n⁺ source region 14 and p⁺ contact region 13b so as to contact n⁺ source region 14 and p⁺ contact region 13b. Interlayer insulating film 9 is provided on the surface of gate electrode 6 to ensure the insulation of gate electrode 6 from source electrode 7 provided thereon.

In edge termination region 2, n⁻ region 3 is formed as a uniform impurity concentration region in a surface layer of the second parallel pn layer (fine SJ cell 12E) opposite to n⁺ semiconductor substrate 11 so as to cover the entire surface of the second parallel pn layer. The impurity concentration of n⁻ region 3 is lower than that of n drift region 12a in active region 1. In n⁻ region 3, p-type guard rings are provided at predetermined intervals. In addition, field insulating film 4 is provided so as to cover the surface of n⁻ region 3. Reference numeral 15 indicates a stopper electrode that prevents the excessive extension of the depletion layer.

The invention is characterized in that the pitch between adjacent second parallel pn layers (fine SJ cells 12E) is two thirds of the pitch between adjacent first parallel pn layers (main SJ cells 12) in active region 1, and no transition portion is provided. The transition portion is a region in which the amount of impurity is between the amount of impurity of n drift region 12a and p partition region 12b in active region 1 and the amount of impurity of n drift region 12c and p partition region 12d in edge termination region 2.

The pitch between adjacent first parallel pn layers is the pitch between n drift region 12a and p partition region 12b adjacent to each other. The pitch between adjacent second parallel pn layers is the pitch between n drift region 12c and p partition region 12d adjacent to each other. That is, at the boundary between the first parallel pn layer and the second parallel pn layer, the ends of two sets of adjacent main SJ cells 12 of the first parallel pn layers face the ends of three sets of adjacent fine SJ cells 12E of the second parallel pn layers.

In edge termination region 2, the second parallel pn layers (fine SJ cells 12E) are formed in a fine pattern in which the pitch between adjacent second parallel pn layers is two thirds of the pitch between adjacent first parallel pn layers (main SJ cells 12) in active region 1. In this way, it is possible to reduce a process variation and mutual diffusion between the p-type partition region and the n-type drift region, as compared to the SJ structure according to the related art. In the SJ structure according to the related art, in some cases, the pitch between adjacent second parallel pn layers in the edge termination region is half the pitch between adjacent first parallel pn layers in the active region (see FIG. 4 which will be described below). In addition, when a device is turned off, the depletion layer is more likely to be spread in edge termination region 2 than in active region 1. Therefore, it is possible to obtain a further high breakdown voltage.

Figure 4:
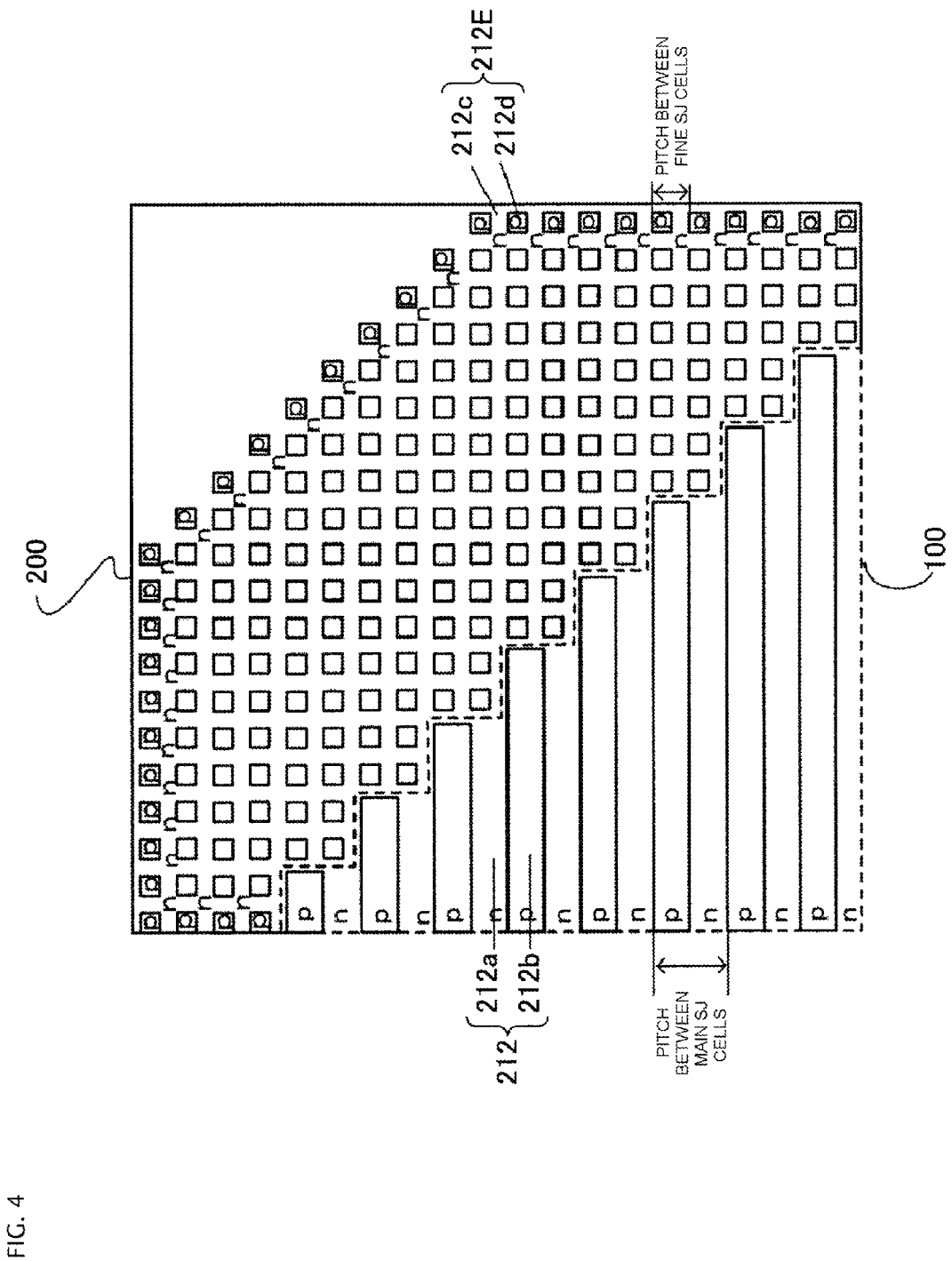
FIG. 4 is an enlarged plan view illustrating a portion of an edge termination region according to the related art.

This point will be described in detail while comparing the planar layout of edge termination region 2 according to the first embodiment of the invention illustrated in FIG. 2 with the planar layout of the edge termination region according to the related art illustrated in FIG. 4. FIG. 4 is an enlarged plan view illustrating a portion of the edge termination region according to the related art. FIG. 4 illustrates the planar layout of a chip corner where the SJ-MOSFET according to the related art is formed. The range of the region illustrated in FIG. 4 is the same as that of the region surrounded by the rectangle ABCD illustrated in FIG. 2.

As illustrated in FIG. 4, in the SJ-MOSFET according to the related art, the first parallel pn layers (main SJ cells 212) in which n-type regions 212a and p-type regions 212b are alternately arranged in a direction parallel to the main surface of a substrate are provided in active region 100. The second parallel pn layers (fine SJ cells 212E) in which n-type regions 212c and p-type regions 212d are alternately arranged in the direction parallel to the main surface of the substrate are provided in edge termination region 200. In the related art, the pitch between the parallel pn layers (fine SJ cells 212E) in edge termination region 200 is half the pitch between the first parallel pn layers (main SJ cells 212) in active region 100.

In edge termination region 2 according to the first embodiment of the invention, it is possible to reduce the influence of a process variation which is likely to occur in parallel pn layer 212E of edge termination region 200 according to the related art and it is easy to control the amount of impurity. In addition, it is possible to reduce the influence of the mutual diffusion between n drift region 12c and p partition region 12d in edge termination region 2.

As in the SJ-MOSFET according to the related art, when the number of pitches between the main SJ cells in the active region is an odd number and a transition portion between the fine SJ cells is needed, it is necessary to finely arrange the SJ cells for a charge balance in the transition portion. In this case, the process variation increases, which is not preferable. In contrast, in the SJ-MOSFET according to the invention, since the number of pitches between main SJ cells 12 in active region 1 is an even number, it is not necessary to provide the transition portion in which the cells are finely arranged. Therefore, it is possible to simplify the planar layout.

Furthermore, in the SJ-MOSFET according to the invention, at the boundaries between the first parallel pn layers (main SJ cells 12) and the second parallel pn layers (fine SJ cells 12E) at four corners of the SJ-MOSFET formed in a rectangular chip, the ends of two pitches of the first parallel pn layers face the ends of three pitches of the second parallel pn layers. Therefore, it is possible to maintain the charge balance without providing a transition portion.

The planar layout of the corners of the high breakdown voltage semiconductor device illustrated in FIG. 2 is an illustrative example, and can be changed in various ways. For example, the planar shape of p partition region 12d of second parallel pn layer 12E in edge termination region 2 is not limited to a square shape, but may be a circle or a polygon, such as a rectangle or a hexagon.

Second Embodiment

Figure 5:
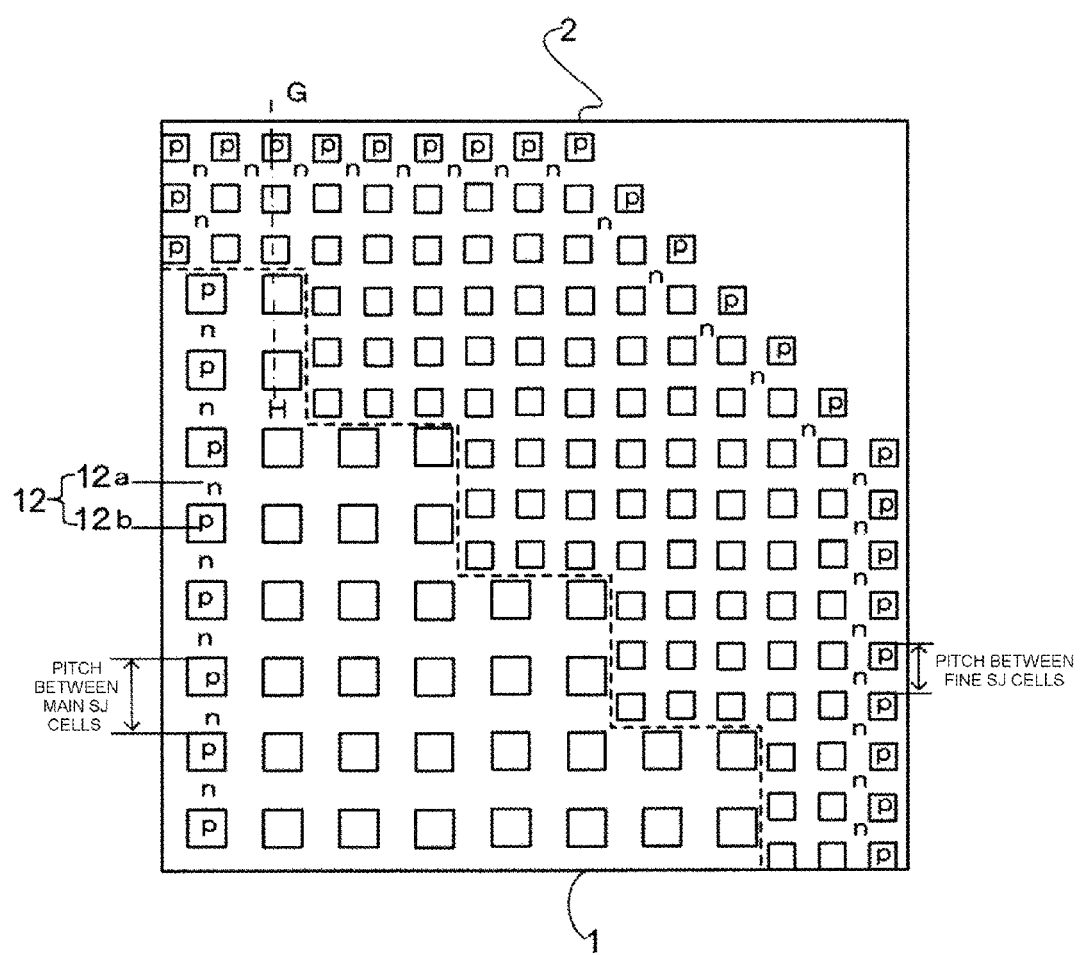
FIG. 5 is an enlarged plan view illustrating a part of an SJ-MOSFET according to a second embodiment of the invention.
Figure 6:
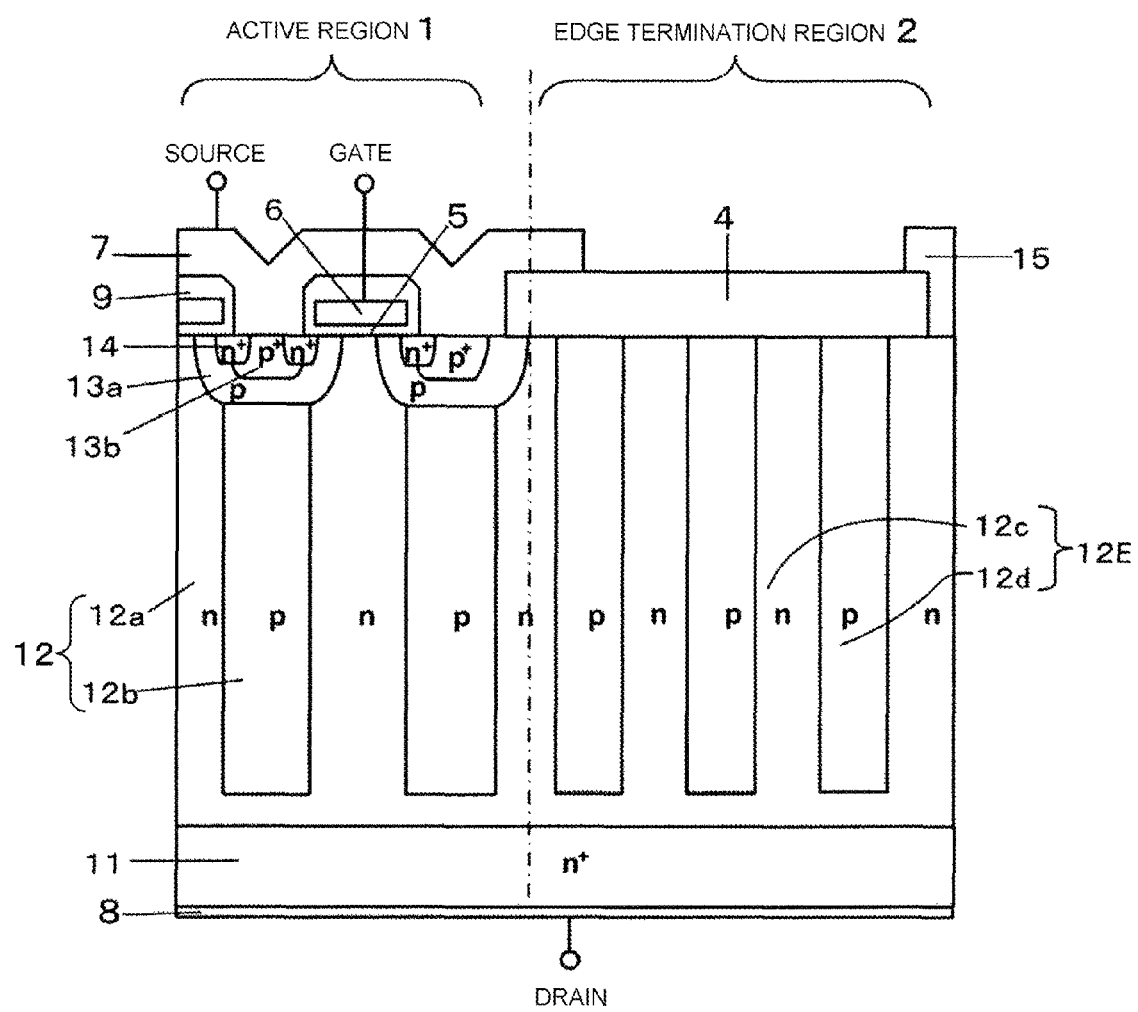
FIG. 6 is a cross-sectional view illustrating a cross-sectional structure along the cutting line G-H of FIG. 5.

FIG. 5 is an enlarged plan view illustrating a portion of an SJ-MOSFET according to a second embodiment of the invention. FIG. 6 is a cross-sectional view illustrating a cross-sectional structure along the cutting line G-H of FIG. 5. FIG. 5 illustrates another example of the portion surrounded by the rectangle ABCD in FIG. 1. There are two differences between the SJ-MOSFET according to the second embodiment and the SJ-MOSFET according to the first embodiment. The first difference is that the parallel pn layers (main SJ cell 12) which are arranged in a repetitive pattern in active region 1 do not have a stripe-shaped planar layout, but have a planar layout in which p partition regions 12b are arranged in a matrix in n drift region 12a.

The second difference is that n⁻ region 3 is not formed as a uniform impurity concentration region in the surface of edge termination region 2. The SJ-MOSFET according to the second embodiment has the same structure as the SJ-MOSFET according to the first embodiment except for the above-mentioned two differences. In the SJ-MOSFET according to the second embodiment, the pitch between second parallel pn layers 12E in edge termination region 2 is less than (about two thirds of) the pitch between the parallel pn layers 12 in active region 1. Therefore, similarly to the first embodiment, when the SJ-MOSFET is turned off, the depletion layer is more likely to be spread in edge termination region 2 than in active region 1 and it is possible to obtain a further high breakdown voltage.

As described above, according to the above-described invention, since the pitch between the second parallel pn layers in the edge termination region is two thirds of the pitch between the first parallel pn layers in the active region, it is possible to reduce a process variation and the mutual diffusion between the p-type partition region and the n-type drift region in the parallel pn layer, as compared to the SJ structure according to the related art. In addition, according to the invention, the semiconductor region in the parallel pn layer does not include a transition portion (n⁻ region) for a charge balance. Therefore, when the SJ-MOSFET is turned off, the drift layer is depleted at the lowest breakdown voltage and it is easy to obtain the highest breakdown voltage characteristics.

In the above-described embodiments of the invention, the SJ-MOSFET is described as an example, but the invention is not limited to the above-described embodiments. The invention can be applied to various devices in which the SJ structure is formed in the drift layer. In addition, in the above-described embodiments, the first conductivity-type is an n type and the second conductivity-type is a p type. However, in the invention, the first conductivity-type may be a p type and the second conductivity-type may be an n type. In this case, the same effect as described above is obtained.

INDUSTRIAL APPLICABILITY

As described above, the high breakdown voltage semiconductor device according to the invention is effective in a vertical power semiconductor device with a high breakdown voltage and a high current, such as a MOS (a metal-oxide-semiconductor) field effect transistor, in which a main current flows between two main surfaces of a semiconductor substrate.

Thus, a high breakdown voltage semiconductor device and a method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A high breakdown voltage semiconductor device comprising:
   parallel pn layers that serve as drift layers and include first-conductivity-type semiconductor regions and second-conductivity-type semiconductor regions which have a longitudinal shape in a direction perpendicular to one main surface of a semiconductor substrate that is a first conductivity-type and has high impurity concentration, and are alternately adjacent to each other in a direction parallel to the main surface of the semiconductor substrate, wherein
   a current flows through the parallel pn layer in an on-state and the parallel pn layer is depleted in an off-state to sustain a high voltage,
   the parallel pn layers include first parallel pn layers that are provided in an active region serving as a main current path and second parallel pn layers that are provided in a edge termination region surrounding the active region,
   the number of pitches between the first-conductivity-type semiconductor region and the second-conductivity-type semiconductor region adjacent to each other in the active region is an even number;
   a pitch between the first-conductivity-type semiconductor region and the second-conductivity-type semiconductor region adjacent to each other in the second parallel pn layer is two thirds of a pitch between the first-conductivity-type semiconductor region and the second-conductivity-type semiconductor region adjacent to each other in the first parallel pn layer, and
   a boundary between the first parallel pn layer and the second parallel pn layer at four corners of the semiconductor substrate which has a rectangular shape in a plan view faces two adjacent ends of the first parallel pn layers and three adjacent ends of the second parallel pn layers.

2. The high breakdown voltage semiconductor device according to claim 1, further comprising:
   a low-concentration first-conductivity-type semiconductor region that is provided in a surface of the second parallel pn layer and has an impurity concentration lower than that of the first-conductivity-type semiconductor region of the first parallel pn layer.

3. The high breakdown voltage semiconductor device according to claim 2, wherein the first parallel pn layers have a stripe-shaped planar layout in which they extend in a direction perpendicular to a direction in which the first-conductivity-type semiconductor regions and the second-conductivity-type semiconductor regions are alternately arranged.

4. The high breakdown voltage semiconductor device according to claim 1, wherein the lengths of the ends of the first parallel pn layers disposed at the four corners of the semiconductor substrate are changed for every even-numbered pitch to form curved portions in parts of the outer circumference of the active region which are arranged in the vicinity of the four corners of the edge termination region, and the innermost end of the second parallel pn layer has a length corresponding to the curved portion and extends to the inside of the semiconductor substrate in parallel to the main surface of the semiconductor substrate.

5. The high breakdown voltage semiconductor device according to claim 4, wherein the first parallel pn layers have a planar layout in which the second-conductivity-type semiconductor regions are arranged in a matrix in the first-conductivity-type semiconductor region.

6. The high breakdown voltage semiconductor device according to claim 1, wherein the semiconductor region in the parallel pn layer does not include a transition portion for a charge balance.

* * * * *